United States Patent
Bracker et al.

(10) Patent No.: US 12,248,030 B2
(45) Date of Patent: Mar. 11, 2025

(54) TEST ARRANGEMENT FOR TESTING A POWER ELECTRONICS CONTROLLER, AND POWER ELECTRONICS MODULE FOR SUCH A TEST ARRANGEMENT

(71) Applicant: dSPACE GmbH, Paderborn (DE)

(72) Inventors: Joerg Bracker, Paderborn (DE); Daniel Epping, Paderborn (DE)

(73) Assignee: DSPACE GMBH, Paderborn (DE)

( * ) Notice: Subject to any disclaimer, the term of this patent is extended or adjusted under 35 U.S.C. 154(b) by 220 days.

(21) Appl. No.: 18/059,486

(22) Filed: Nov. 29, 2022

(65) Prior Publication Data

US 2023/0168313 A1 Jun. 1, 2023

(30) Foreign Application Priority Data

Dec. 1, 2021 (EP) ..................................... 21211759

(51) Int. Cl.
*G01R 31/40* (2020.01)
*G01R 31/42* (2006.01)
*H02J 3/00* (2006.01)

(52) U.S. Cl.
CPC ................ *G01R 31/42* (2013.01); *H02J 3/00* (2013.01)

(58) Field of Classification Search
CPC ............ G01R 31/2829; G01R 31/2837; G01R 31/2839; G01R 31/2848; G01R 31/34; G01R 31/40; G01R 31/42; G01R 31/343
See application file for complete search history.

(56) References Cited

U.S. PATENT DOCUMENTS

| | | | |
|---|---|---|---|
| 11,567,138 B2* | 1/2023 | Vuorio | B66B 5/0037 |
| 2007/0165438 A1* | 7/2007 | Chou | G01R 31/31721 365/51 |
| 2012/0139576 A1* | 6/2012 | Dreyer | G01R 31/343 324/764.01 |
| 2018/0123497 A1* | 5/2018 | Holthaus | G05B 17/02 |

FOREIGN PATENT DOCUMENTS

| | | |
|---|---|---|
| CN | 111781532 A | 10/2020 |
| EP | 2953246 A2 | 12/2015 |
| EP | 3316477 A1 | 5/2018 |

* cited by examiner

*Primary Examiner* — Thang X Le

(74) *Attorney, Agent, or Firm* — LEYDIG, VOIT & MAYER, LTD.

(57) ABSTRACT

A power electronics module for a test arrangement for testing a power electronics controller includes: supply connections for supplying energy; at least one load connection for providing at least one electrical connection variable; a supply circuit for providing electrical control voltages; a selection circuit with circuit breakers for switching one of the electrical control voltages onto the at least one load connection of the power electronics module; and an interface for controlling the circuit breakers. The supply connections of the power electronics module are AC supply connections. The supply circuit is a multi-phase circuit for providing a plurality of phase voltages on a plurality of phase conductors. The selection circuit connects a phase conductor to the at least one load connection of the power electronics module.

9 Claims, 6 Drawing Sheets

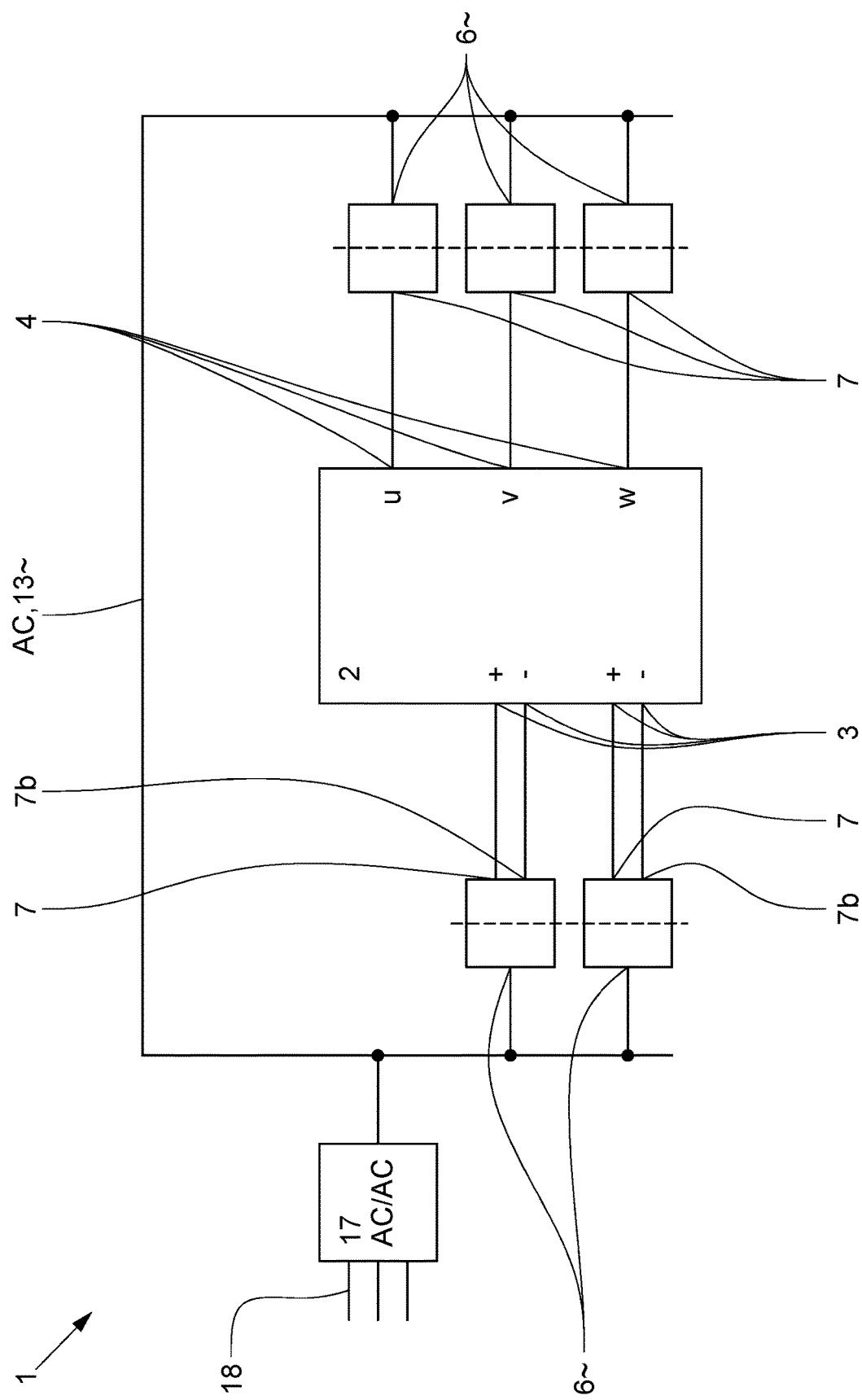

TEST ARRANGEMENT FOR TESTING A POWER ELECTRONICS CONTROLLER, AND POWER ELECTRONICS MODULE FOR SUCH A TEST ARRANGEMENT

CROSS-REFERENCE TO PRIOR APPLICATIONS

This application claims benefit to European Patent Application No. EP 21211759.2, filed on Dec. 1, 2021, which is hereby incorporated by reference herein.

FIELD

The invention relates to a test arrangement for testing a power electronics controller, wherein the controller has supply connections for supplying energy and load connections for controlling an electrical load, with a plurality of power electronics modules, wherein each power electronics module has supply connections for supplying energy, at least one load connection for providing at least one electrical connection variable, a supply circuit for providing electrical control voltages, a selection circuit with circuit breakers for switching one of the control voltages onto the load connection of the power electronics module, and an interface for controlling the circuit breakers, wherein when the test arrangement is in an operational state, the supply connections and/or the load connections of the controller are in each case connected to the load connection of a power electronics module for providing a desired electrical connection variable at the supply connections and the load connections of the controller, and wherein the supply connections of the power electronics modules are connected to one another via an electrical intermediate network. In addition, the invention also relates to a power electronics module for such a test arrangement.

BACKGROUND

Test arrangements of the aforementioned type are known from the prior art and serve for testing power electronic controllers such as are used in very different fields of technology, for example in the automotive sector, in the aerospace sector, and also in industrial applications, such as process engineering applications. The power electronics controller is designed to control electrical loads, wherein the absolute level of electrical power to be controlled is not important. It is possible that only power levels of a few watts need to be handled, but it can also be the case that power levels in the range of a few 100 kW (or more) have to be controlled.

A typical example of a power electronics controller in the automotive sector is a motor controller for an electric motor. In real application, i.e., not in the test with the test arrangement, the motor controller is usually supplied via its supply connections via a DC source, and the load connections of the motor controller are connected to the corresponding supply connections of the motor. The DC voltage sources are, for example, batteries. Depending on whether the connected electric motor is operated by a motor or a generator, the energy flow through the power electronics controller can run from its supply connections to the load connections, but also vice versa from the load connections to the supply connections.

In the test arrangement considered here, the environment of the power electronics controller to be tested is simulated with the test arrangement at least in part by power electronics; in other words, no actual motor is connected to the load connections of the power electronics controller, but rather corresponding power electronics modules. The application is called a hardware-in-the-loop simulation (HIL simulation). Usually, power electronics modules corresponding to the supply connections of the power electronics controller are also connected. With the power electronics modules, it is possible to simulate not only electrical energy sources but also electrical energy sinks. For this purpose, the power electronics module can be controlled via an interface in such a way that a specific electrical connection variable is set at its load connection, i.e., a specific voltage or a specific current.

It follows from the foregoing that the claimed test arrangement does not include the power electronics controller itself that is to be tested, but the nature of the power electronics controller to be tested must be described since otherwise, the interaction of the components of the claimed test arrangement will not be understandable. If, when the test arrangement is in the operational state, the supply connections and/or the load connections of the controller are each connected to the load connection of a power electronics module for providing a desired electrical connection variable at the supply connections and the load connections of the controller, then this clearly means that, in order to produce the operational state of the test arrangement, a connection must be made of the power electronics modules comprised by the test arrangement to the corresponding connections of the power electronics controller not included in the test arrangement; the load connections of the power electronics modules can therefore be connected to the supply connections and/or to the load connections of the controller that is to be tested.

The manner in which the power electronics module must be controlled via its interface so that the desired electrical connection variable is set at its load connection is usually determined by calculating corresponding mathematical motor models and/or battery models on an HIL simulator. For this purpose, the real electrical connection variables are captured by measurement, further processed within the framework of the mathematical models while taking into account the connection variables desired in the model, and corresponding control sequences for the circuit breakers contained in the power electronics modules are calculated and output to the interface of the power electronics modules. This process is not of interest for the question pursued here; it is in part, for example, the subject-matter of the European patent application with publication number EP 3316477 A1.

The connection of the supply connections of the power electronics modules via the electrical intermediate network has the advantage that electrical energy can be exchanged between the power electronics modules. Only the energy that is dissipated by the test arrangement and the power electronics controller to be tested needs be fed into the electrical intermediate network from outside. It can therefore be the case that electrical currents within a range of a few 1000 A are exchanged between the power electronics modules via the intermediate network, but only a few amperes need to be fed in via an external energy source connected to the intermediate network. In the prior art, the electrical intermediate network is designed as a DC intermediate network. Accordingly, even the supply connections of the power electronics modules in the prior art are designed as DC supply connections (dSPACE GmbH: "Power hardware-in-the-loop testing; closing the gap between HIL and dynamometer testing," product catalog, September 2021).

When using a DC intermediate network, it has proven time-consuming if components are to be integrated into the test arrangement which do not have a DC supply to their supply connections but instead must be connected to an AC network. This can be the case, for example, if there is a specification that on the power electronics controller, on the supply side or load side, corresponding AC-fed loads (which can also be understood to be energy sources, i.e., for example, AC-fed battery emulators) are to be used. The AC-fed loads are then connected directly to an AC network. This, however, eliminates the possibility of connecting these loads to the DC intermediate network, whereby the energy required to operate the test arrangement can increase considerably. In addition, to supply the DC intermediate network, fully regenerative power supply units with a rectifier are required, which is complex and represents a not inconsiderable cost factor.

SUMMARY

In an exemplary embodiment, the present invention provides a power electronics module for a test arrangement for testing a power electronics controller. The power electronics module includes: supply connections for supplying energy; at least one load connection for providing at least one electrical connection variable; a supply circuit for providing electrical control voltages; a selection circuit with circuit breakers for switching one of the electrical control voltages onto the at least one load connection of the power electronics module; and an interface for controlling the circuit breakers. The supply connections of the power electronics module are AC supply connections. The supply circuit is a multi-phase circuit for providing a plurality of phase voltages on a plurality of phase conductors. The selection circuit connects a phase conductor to the at least one load connection of the power electronics module.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 6 depicts a test arrangement with a plurality of power electronics modules equipped with a controller having a plurality of supply connections for a plurality of energy sources.

DETAILED DESCRIPTION

Figure 1:
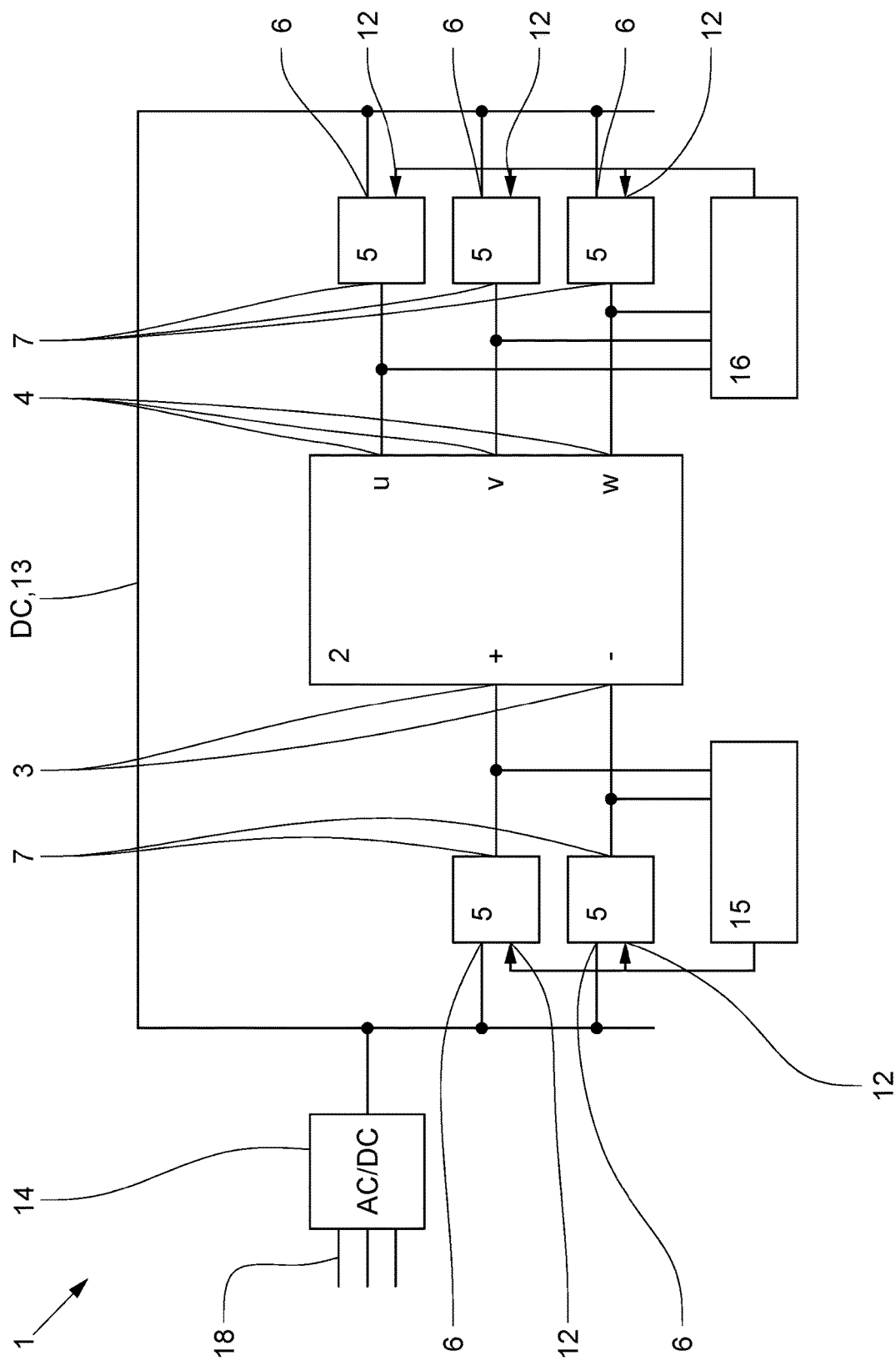
FIG. 1 depicts a conventional test arrangement for testing a power electronics controller.

Exemplary embodiments of the present invention provide a test arrangement for testing a power electronics controller and a power electronics module for such a test arrangement which avoids the disadvantages described above.

In an exemplary embodiment, for the test arrangement, the supply connections of the power electronics modules are designed as AC supply connections, the electrical intermediate network is designed as an AC intermediate network, and the supply circuit is designed as a multi-phase circuit for providing a plurality of phase voltages on a plurality of phase conductors, wherein the selection circuit with the circuit breakers is designed to connect a phase conductor to the load connection of the power electronics module. Since the supply connections of the power electronics modules are designed as AC supply connections, and the power electronics modules are therefore suitable for being operated with alternating current, it is possible without further ado to integrate into the test arrangement even such devices whose operation requires a supply of alternating current. Bypassing the intermediate network can be dispensed with; use of the intermediate network is maintained. The alternating current required for operation can be drawn from the AC intermediate network. If only alternating current is mentioned here and not, for example, alternating voltage, this is due to the fact that AC and DC (i.e., alternating current or direct current) power supply units/devices/intermediate networks are addressed in the technical literature, that is to say in most cases, a reference is made to current.

In a preferred embodiment of the test arrangement, it is provided that the AC intermediate network can be connected to an external AC power network via a connection. The external AC power network is, for example, to be understood as the AC incoming service connection of the environment (of the laboratory) in which the test arrangement is accommodated. The connection may comprise an AC transformer (AC/AC). The AC transformer can be designed for relatively low power levels since the components of the test arrangement are connected to the AC intermediate network and the energy supply is substantially realized by the exchange of energy via the AC intermediate network, and only the energy that has actually dissipated in the test arrangement needs to be replaced. In a preferred embodiment, the AC intermediate network is of a three-phase design.

An advantageous embodiment of the test arrangement is characterized in that the power electronics module has a galvanic isolation between the supply connections and the load connection of the power electronics module, wherein the galvanic isolation is preferably realized by a transformer. This measure yields a surprising variety of advantageous features.

Due to the galvanic isolation, the load connection of the power electronics module no longer has a fixed reference potential, except of course for the electrical potential at an always present further reference load connection of the power electronics module. However, even the electrical potential of this further reference load connection of the power electronics module is also potential-free with respect to other load connections (including reference load connections) of further power electronics modules which are likewise galvanically isolated from their supply connections. This makes it possible, for example, to connect the load connections of various power electronics modules in series in order to provide, for example, a higher voltage. Furthermore, there is also no problem whatsoever in connecting the load connections of a plurality of such power electronics modules to a plurality of supply connections of a controller to be tested, if the controller supports the use of a plurality of energy sources, for example. Due to the potential-free nature of the supply connections of various power electronics modules, it is no longer important to know how the controller to be tested interconnects these different power electronics modules internally, switches the load connections of the various power electronics modules in series, or also switches them together in parallel (or, depending on the operating point, switches sometimes in series and sometimes in parallel) because an actual potential isolation exists on the side of the load connections of the power electronics modules. In this regard, the power electronics modules behave like "real" batteries as frequently employed in the standard use of controllers. Another advantage is that the load connections of the power electronics modules considered here can also be connected to other devices, for example to power supply units or signal generators for the purpose of superimposing interference or useful signals (for example a ripple generator). Another advantage of the transformer-based galvanic isolation of the supply connections of a power electronics module from the load connections of this power electronics module is that a high common-mode rejection between the load side and the supply side of the power electronics module is achieved, so that common mode interference is not transferred from the load connections of the power electronics module to the supply connections of the power electronics module and thus into the AC intermediate network. This also applies in the reverse direction.

In one embodiment of the test arrangement or of the power electronics modules, it is provided that the transformer of the power electronics module is three-phase on the supply side and at least three-phase on the load side, in particular is designed to be six-phase or nine-phase. The use of a three-phase supply to the power electronics module has the advantage that a plurality of different electrical potentials is already present, wherein at least these three different electrical potentials are also used on the load side due to the at least three-phase design of the load side of the transformer. If the transformer is designed with as many as six or nine phases on the load side, even more different electrical potentials will be present at the same time. This is advantageous insofar as the circuit breakers of the selection circuit arranged between the load-side part of the transformer and the load connections of the power electronics module can select much finer gradations between different electrical potentials, which are then connected as required (and controllable via the interface for actuating the circuit breakers) to the load connection of the power electronics module in order to achieve the corresponding desired electrical connection variable.

A further embodiment of the test arrangement or of the power electronics modules is characterized in that the circuit breakers of the selection circuit comprise bidirectionally blockable power semiconductors, in particular bidirectional MOSFET switches, preferably based on silicon carbide. For this purpose, two MOSFET switches are connected in series with freewheeling diodes oriented in opposite directions so that currents can be reliably blocked in any flow direction.

The invention further relates to a power electronics module for a test arrangement for testing a power electronics controller, wherein the power electronics module has supply connections for supplying energy, at least one load connection for providing at least one electrical connection variable, a supply circuit for providing electrical control voltages, a selection circuit with circuit breakers for switching one of the control voltages onto the load connection of the power electronics module, and an interface for controlling the circuit breakers, wherein according to the invention, it is provided that the supply connections of the power electronics module are designed as AC supply connections, and the supply circuit is designed as a multi-phase circuit for providing a plurality of phase voltages on a plurality of phase conductors, wherein the selection circuit with the circuit breakers is designed for connecting a phase conductor to the load connection of the power electronics module. In further embodiments, the power electronics module is distinguished by the features of the power electronics modules which have previously been described in connection with the power electronics modules of the test arrangement.

FIG. 1 shows a conventional test arrangement 1 for testing a power electronics controller 2. The controller 2 has supply connections 3 for the energy supply and load connections 4 for controlling an electrical load. The test arrangement 1 has a plurality of power electronics modules 5, wherein each power electronics module 5 has supply connections 6 for the energy supply, at least one load connection 7 for providing at least one electrical connection variable, a supply circuit for providing electrical control voltages, a selection circuit with circuit breakers for switching one of the control voltages onto the load connection of the power electronics module 5, and an interface 12 for controlling the circuit breakers 11.

In the operational state of the test arrangement 1 as shown in FIG. 1, the supply connections 3 and/or the load connections 4 of the controller 2 are in each case connected to the load connection 7 of a power electronics module 5 for providing a desired connection variable at the supply connections 3 and the load connections 4 of the controller 2. The supply connections 6 of the power electronics modules 5 are connected to one another via an electrical intermediate network 13. In the prior art, the electrical intermediate network 13 is a DC intermediate network. Accordingly, in the prior art, the supply connections 6 of the power electronics modules 5 are also DC supply connections. The power electronics modules 5 can exchange energy via the intermediate network 13, which allows the test arrangement 1 to be operated in an energy-saving manner. The external mains connection 14 shown in FIG. 1 comprises a fully regenerative power supply unit with rectifier (AC/DC) and can feed energy into the test arrangement 1 via the intermediate network 13. Since energy can be exchanged between the power electronics modules 5 via the intermediate network 13, only a small amount of energy needs to be fed in via the external mains connection 14, namely the part of the energy which is dissipated during operation of the test arrangement 1.

The test arrangement 1 simulates the later environment of the power electronics controller 2 to be tested. In the shown exemplary embodiment, both the energy supply through the power electronics modules 5 at the supply connections 3 of the controller 2 and the load at the load connections 4 of the controller 2, likewise through power electronics modules 5 which are connected via their load connections 4 to the load connections 7 of the controller 2, are simulated. In the exemplary embodiment shown in FIG. 1, this is a motor controller 2 for the automotive sector. The energy supply takes place in real standard use of the controller 2 via a battery, and the load of the controller 2 in standard use consists of a three-phase electric motor which can be operated not only by motor but also by generator. Consequently, an energy flow could thus take place not only from the supply connections 3 to the load connections 4 of the controller 2 but also from the load connections 4 to the supply connections 3 of the controller 2.

FIG. 1 does not show in detail how the internal structure of the power electronics modules 5 is realized. In any case, the power electronics modules 5 comprise a selection circuit with circuit breakers which can be controlled via the interface 12. By appropriately controlling the circuit breakers via the interface 12, the desired electrical connection variable at the load connection 7 of the power electronics module 5 can be set by switching a control voltage of the supply circuit, not shown in detail here, onto the load connection 7. How the circuit breakers must be controlled results from the calculation of a mathematical model of the sources and loads of the controller 2 that are to be replicated, wherein these models are usually calculated in real time via a hardware-in-the-loop simulator. A battery model 15 and a motor model 16 are shown schematically here. The actual connection variables at the load connections 7 of the power electronics modules 5 are captured by measuring and, taking into account the setpoint for the electrical connection variable, corresponding control sequences for the circuit breakers of the selection circuit are then calculated by the models 15, 16. How exactly this takes place is not the subject of the present invention and therefore does not require further explanation; it is only important that there is the possibility of exerting a corresponding influence on the power electronics module 5 via the interface 12.

A problem with the test arrangement according to FIG. 1 is the situation when power electronics modules that must be supplied via alternating current are also to be used. In this case, these power electronics modules have to be supplied via the external AC power network; they cannot be integrated via the DC intermediate network 13. This increases the overall network load. As a result, it can also be necessary for the external mains connection 14 with rectifier, which must also be regenerative, to be designed larger. This is complicated and expensive. The above-described problem is solved with the test arrangements 1 and power electronic modules 5 shown—at least partially—in FIGS. 2 to 6.

Common to the test arrangements 1 in FIGS. 2 to 6 is that the supply connections 6 of the power electronics modules 5 are designed as AC supply connections 6~, and the electrical intermediate network 13 is designed as an AC intermediate network 13~. Furthermore, the supply circuit is designed as a multi-phase circuit 8 for providing a plurality of phase voltages on a plurality of phase conductors 9, wherein the selection circuit 10 with the circuit breakers 11 is designed for connecting a phase conductor 9 to the load connection 7 of the power electronics module 5. The power electronics modules 5 are thus always supplied by alternating current and the energy exchange between the power electronics modules 5, which are connected to their supply connections 6 via the AC intermediate network 13, is accordingly in the form of alternating current.

If, in connection with the exemplary embodiments in FIGS. 2 to 6, the supply connections 6 of the power electronics modules are mentioned, AC supply connections 6~ will therefore always be meant, and if the electrical intermediate network 13 is mentioned, an AC intermediate network 13~ will always be meant.

The described design of the test arrangement 1 has the advantage that even such power electronics modules 5 as are to be supplied with electrical periodic variables on the supply side can easily be integrated into the test arrangement 1 using the intermediate network 13. Such power electronics modules 5 then do not have to be decoupled from the intermediate network 13 and supplied via an external mains connection. The possibility of exchanging energy via the intermediate network 13 is fully retained.

Figure 2:
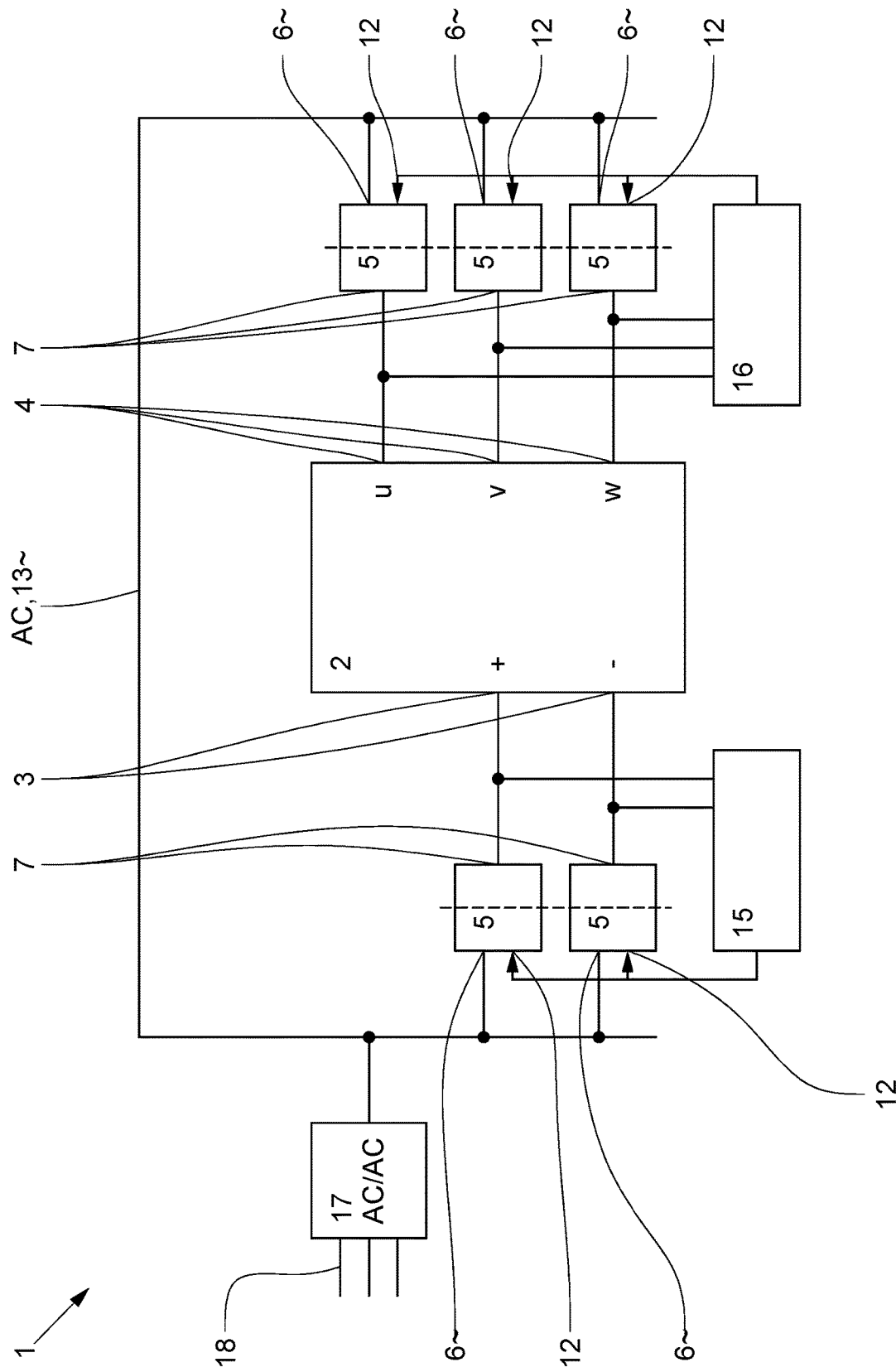
FIG. 2 depicts a test arrangement according to the invention for testing a power electronics controller with power electronics modules with AC supply connections and an AC intermediate network.
Figure 5:
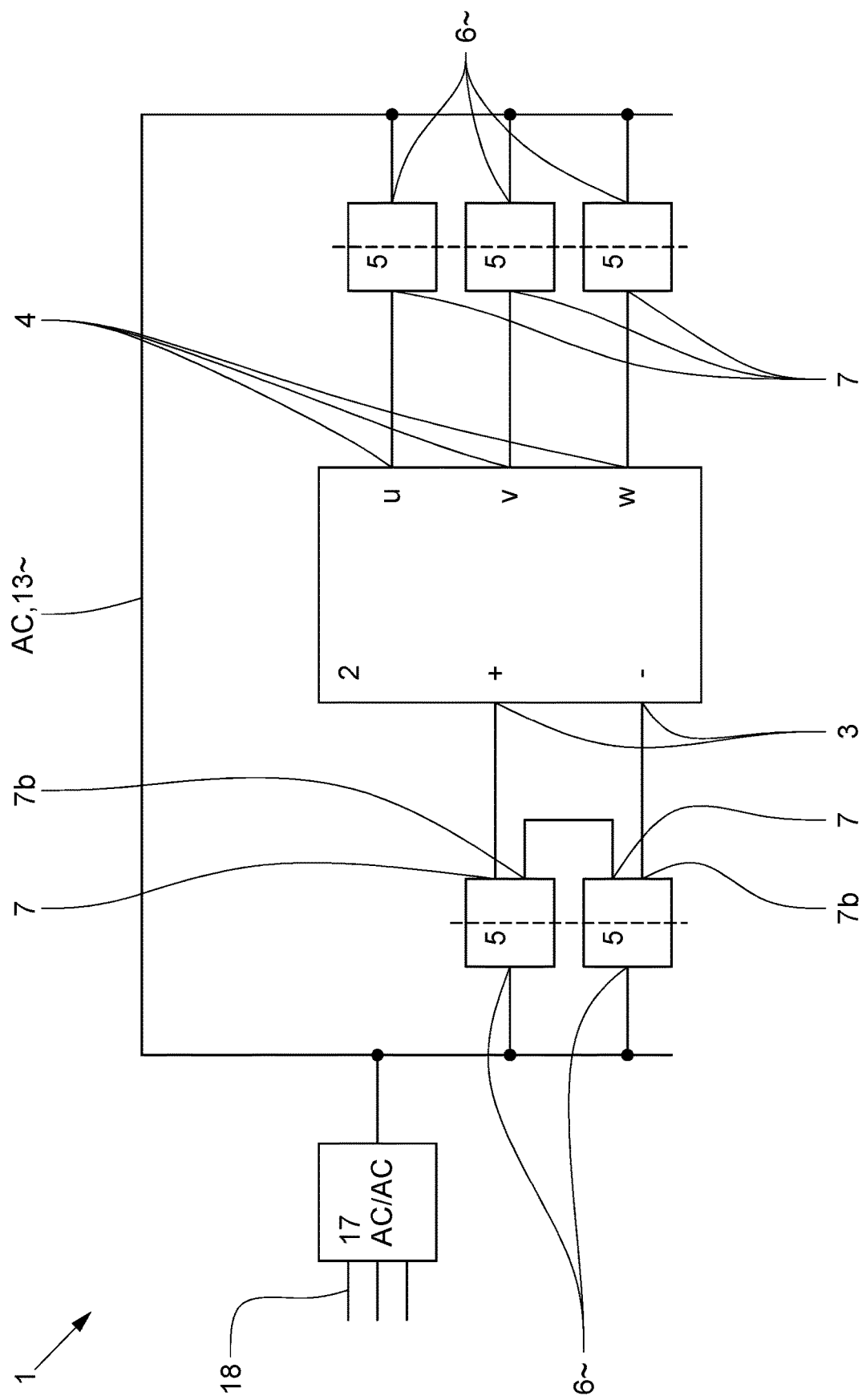
FIG. 5 depicts an exemplary embodiment of a test arrangement with power electronics modules whose load connections are connected in series.

In the exemplary embodiments according to FIGS. 2, 5 and 6, the AC intermediate network 13~ is connectable via a connection 17 to an external AC network 18, wherein the connection 17 here is a simple transformer without a rectifier (AC/AC). During operation of the test arrangement 1 according to FIGS. 2 to 6, only the energy dissipated during operation of the test arrangement 1 by the elements of the test arrangement 1 needs be supplied via the connection 17. Furthermore, what all of the exemplary embodiments of FIGS. 2 to 6 for the test arrangement 1 and also for the power electronics modules 5 have in common is that the AC intermediate network 13~ is three-phase, and accordingly the supply connections 6 of the power electronics modules 5 are of three-phase design.

It is particularly advantageous that the power electronics modules 5 shown in FIGS. 2 to 6 have a galvanic isolation between the supply connections 6 and the load connections 7 of the power electronics modules 5 (indicated by the vertical dashed line in FIGS. 2, 5 and 6). Technically, the galvanic isolation is realized in each case by a transformer 19. This results in a large number of advantages. Due to the fact that the load connection 7 is potential-free with respect to the supply connection 6 on account of the galvanic isolation, the load connections 7 of different power electronics modules 5 can be interconnected. Additional devices can also be connected to the load connections 7 of the power electronics modules 5, for example signal generators for applying superimposed interference signals. By realizing the galvanic isolation with the transformer 19, a high common-mode rejection is achieved between the supply side and the load side of the power electronics module 5 so that common-mode errors are not transmitted—or are only transmitted strongly dampened—from the load side to the supply side and vice versa.

Figure 3:
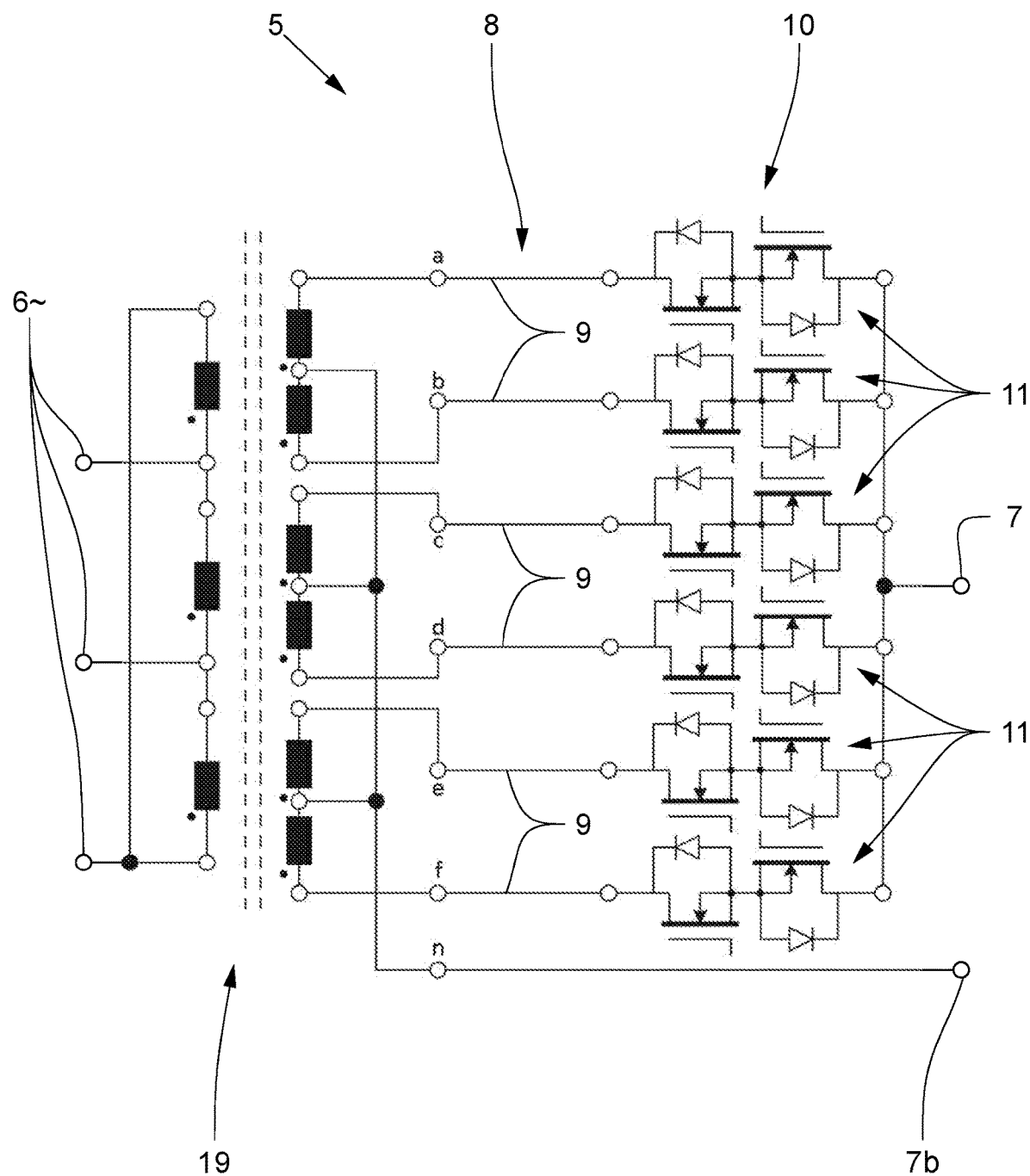
FIG. 3 depicts an exemplary embodiment of a power electronics module according to the invention.
Figure 4:
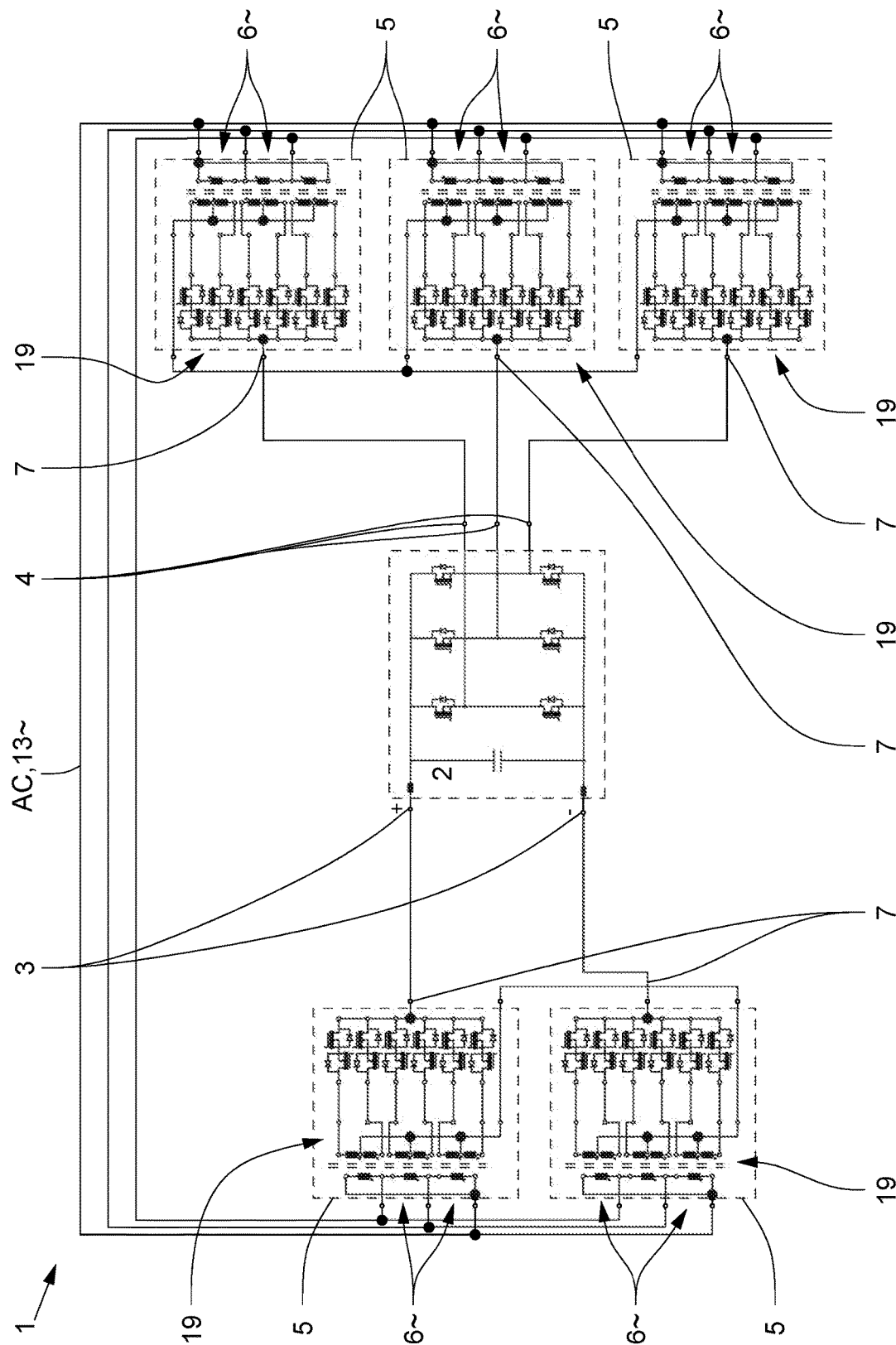
FIG. 4 depicts an exemplary embodiment of a test arrangement according to the invention with a plurality of power electronics modules according to FIG. 3.

As can be seen from FIG. 3, the transformer 19 is realized as a 3-to-6-phase transformer, wherein the supply side is realized with three coils in a delta connection, and the load side is realized with six coils in a star connection. The six coils are functionally composed of three coils with center tapping. The advantage of a larger number of phases on the load side is that a larger number of phase voltages are simultaneously available on the phase conductors 9 of the multi-phase circuit 8. Due to the greater number, the phase voltages are more finely stepped in terms of potential with respect to one another. The phase voltages can then be switched to the load connection 7 of the power electronics module 5 by operating the circuit breakers 11 of the selection circuit 10. In FIG. 5, the interface for controlling the circuit breakers 11 is not shown in detail for reasons of clarity. The circuit breakers 11 of the selection circuit 10 in this case are bidirectionally blockable power semiconductors, namely bidirectional MOSFET switches based on silicon carbide. It goes without saying that the interface 12 for actuating the circuit breakers 11 comprises corresponding control lines which are connected to the gate terminals of the MOSFET switches.

It can also be seen from FIG. 3 that the star point of the coils connected together in a star connection on the load side is made available as a further load connection, namely as a reference load connection 7b of the power electronics module 5. It is basically always necessary to lead such a reference load connection 7b out of the power electronics module 5 since the electrical potential at the load connection 7 must always be set only in relation to a reference potential. So that precisely this potential gradient can also work, the reference potential must be made available in terms of circuitry, here by the reference load connection 7b.

FIG. 4 again shows a test arrangement 1 with power electronics modules 5 which correspond to the power electronics modules 5 according to FIG. 3. All power-electronic connections, i.e., the supply connections 3 and the load connections 4 of the controller 2 to be tested, are supplied or loaded in this case via power electronics modules 5. As mentioned at the outset, the power electronics controller 2 to be tested does not belong to the claimed test arrangement 1; the controllers 2 are shown in order to better explain the functioning of the test arrangement 1.

In the exemplary embodiment according to FIG. 5, an advantageous application of the power electronics modules 5 with galvanic isolation is shown. In the exemplary embodiment, it is readily possible to connect two power electronics modules 5 in series in order to bring about a higher output voltage. The load connections 7 or reference load connections 7b can be easily connected to one another in this case since the load connections 7, 7b of each power electronics module 5 are potential-free in relation to the load connections 7, 7b of another power electronics module 5.

A further advantageous application is shown in FIG. 6. In this case, a controller 2 to be tested has two pairs of load connections 3 for connecting two energy sources (batteries in standard use). Internally, the controller 2 switches the two energy sources selectively in series or even in parallel depending on the load state. If, in this situation, power electronics modules were to be used which would, as regards potential, have a fixed reference to the voltages of the intermediate network 13~, for example, then these power electronics modules could not simply be connected to the supply connections 3 of the controller 2. Since, however, the power electronics modules 5 used in the depicted exemplary embodiment have a galvanic isolation, the use of these power electronics modules 5 in the depicted application is completely unproblematic.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SIGNS

1 Test arrangement
2 Power electronics controller
3 Supply connections of the controller
4 Load connections of the controller
5 Power electronics module
6 Supply connections of the power electronics module
6~ AC supply connections of the power electronics module
7 Load connections of the power electronics module
7b Reference load connection of the power electronics module
8 Multi-phase circuit
9 Phase conductor
10 Selection circuit with circuit breakers
11 Circuit breaker
12 Interface for controlling the circuit breakers
13 Electrical intermediate network
13~ AC intermediate network
14 Mains connection with fully regenerative power supply unit with rectifier (AC/DC)
15 Battery model
16 Motor model
17 Connection with transformer (AC/AC)
18 External AC network
19 Transformer for galvanic isolation

The invention claimed is:

1. A test arrangement for testing a power electronics controller, wherein the power electronics controller has supply connections for supplying energy and load connections for controlling an electrical load, the test arrangement comprising:
a plurality of power electronics modules, wherein each power electronics module comprises:
supply connections for supplying energy;
at least one load connection for providing at least one electrical connection variable;
a supply circuit for providing electrical control voltages;
a selection circuit having circuit breakers for switching one of the electrical control voltages onto the at least one load connection of the power electronics module; and
an interface for controlling the circuit breakers;
wherein the test arrangement is configured to simulate an environment of the power electronics controller for testing the power electronics controller, wherein simulating the environment of the power electronics controller comprises both the supply connections of the power electronics controller and the load connections of the power electronics controller each being respectively connected to at least one respective load connection of a power electronics module and at least one respective electrical connection variable being provided at the supply connections of the power electronics controller and the load connections of the power electronics controller;
wherein the supply connections of the power electronics modules are connected to one another via an electrical intermediate network;
wherein the supply connections of the power electronics modules are AC supply connections;
wherein the electrical intermediate network is an AC intermediate network;
wherein the supply circuits of the power electronics modules are multi-phase circuits for providing a plurality of phase voltages on a plurality of phase conductors; and wherein the selection circuits of the power electronics modules connect phase conductors to the load connections of the power electronics modules.

2. The test arrangement according to claim 1, wherein the AC intermediate network is connectable to an external AC network.

3. The test arrangement according to claim 1, wherein the AC intermediate network is three-phase.

4. The test arrangement according to claim 1, wherein the power electronics modules each have a galvanic isolation between the supply connections of the power electronics module and the at least one load connection of the power electronics module.

5. The test arrangement according to claim 4, wherein the galvanic isolation is realized by a transformer.

6. The test arrangement according to claim 5, wherein the transformer is three-phase on the supply side and at least three-phase on the load side.

7. The test arrangement according to claim 6, wherein the transformer is realized as a 3-to-6-phase transformer, wherein the supply side is realized with three coils connected in a delta connection, and wherein the load side is realized with six coils in a star connection.

8. The test arrangement according to claim 1, wherein the circuit breakers of the selection circuit comprise bidirectionally blockable power semiconductors.

9. The test arrangement according to claim 1, wherein the power electronics controller is a motor controller for an electric motor, and wherein the at least one respective electrical connection variable provided at the supply connections of the power electronics controller and the load connections of the power electronics controller are based on a battery model and a motor model.

* * * * *